(12) United States Patent
Kubota et al.

(10) Patent No.: US 11,361,969 B2
(45) Date of Patent: Jun. 14, 2022

(54) DEVICE SUBSTRATE WITH HIGH THERMAL CONDUCTIVITY AND METHOD OF MANUFACTURING THE SAME

(71) Applicant: Shin-Etsu Chemical Co., Ltd., Tokyo (JP)

(72) Inventors: Yoshihiro Kubota, Annaka (JP); Shigeru Konishi, Annaka (JP)

(73) Assignee: Shin-Etsu Chemical Co., Ltd.

( * ) Notice: Subject to any disclaimer, the term of this patent is extended or adjusted under 35 U.S.C. 154(b) by 23 days.

(21) Appl. No.: 16/626,154

(22) PCT Filed: Jul. 10, 2018

(86) PCT No.: PCT/JP2018/026068
§ 371 (c)(1),
(2) Date: Dec. 23, 2019

(87) PCT Pub. No.: WO2019/013212
PCT Pub. Date: Jan. 17, 2019

(65) Prior Publication Data
US 2020/0227263 A1   Jul. 16, 2020

(30) Foreign Application Priority Data

Jul. 14, 2017  (JP) .............................. JP2017-138026

(51) Int. Cl.
*H01L 21/20* (2006.01)
*H01L 21/02* (2006.01)
(Continued)

(52) U.S. Cl.
CPC .... *H01L 21/2007* (2013.01); *H01L 21/02164* (2013.01); *H01L 21/304* (2013.01);
(Continued)

(58) Field of Classification Search
None
See application file for complete search history.

(56) References Cited

U.S. PATENT DOCUMENTS

| 2002/0134503 | A1 | 9/2002 | Hussinger et al. |
| 2003/0217805 | A1 | 11/2003 | Takayama et al. |

(Continued)

FOREIGN PATENT DOCUMENTS

| EP | 3537472 A1 | 9/2019 |
| JP | 2004047975 A | 2/2004 |

(Continued)

OTHER PUBLICATIONS

International Search Report for PCT/JP2018/026068 dated Sep. 11, 2018.

(Continued)

*Primary Examiner* — Bradley Smith
(74) *Attorney, Agent, or Firm* — Lerner, David, Littenberg, Krumholz & Mentlik, LLP (57) ABSTRACT

Provided are a device substrate with high thermal conductivity, with high heat dissipation, and with a small loss at high frequencies, and a method of manufacturing the device substrate. A device substrate 1 of the present invention can be manufactured by: provisionally bonding a Si device layer side of an SOI device substrate 10 to a support substrate 20 using a provisional bonding adhesive 31, the SOI device substrate including a Si base substrate 11, a buried layer 12 formed on the Si base substrate, having high thermal conductivity, and being an electrical insulator, and a Si device layer 13 formed on the buried layer; removing the Si base substrate 11 of the provisionally bonded SOI device substrate until the buried layer is exposed, thereby obtaining a thinned device wafer 10a; transfer-bonding the buried layer side of the thinned device wafer and a transfer substrate 40 to each other using a transfer adhesive 32 having a heat- (Continued)

resistant temperature of at least 150° C. by applying heat and pressure, the transfer substrate having high thermal conductivity and being an electrical insulator; and separating the support substrate 20.

12 Claims, 1 Drawing Sheet (51) Int. Cl.
- H01L 21/304 (2006.01)
- H01L 21/762 (2006.01)
- H01L 27/12 (2006.01)

(52) U.S. Cl.
CPC .. *H01L 21/76254* (2013.01); *H01L 21/76262* (2013.01); *H01L 27/1203* (2013.01)

(56) References Cited

U.S. PATENT DOCUMENTS

| | | | |
|---|---|---|---|
| 2005/0227403 A1 | 10/2005 | Muramatsu | |
| 2007/0241416 A1 | 10/2007 | Muramatsu | |
| 2008/0153257 A1* | 6/2008 | Kononchuk | H01L 21/76254 438/455 |
| 2012/0086100 A1* | 4/2012 | Andry | H01L 21/6835 257/506 |
| 2014/0312424 A1 | 10/2014 | Brawley et al. | |
| 2014/0327116 A1 | 11/2014 | Konishi et al. | |
| 2016/0071761 A1* | 3/2016 | Tobisaka | H01L 21/30604 257/506 |
| 2016/0273989 A1* | 9/2016 | Brida | G01L 19/146 |
| 2017/0221786 A1* | 8/2017 | Konishi | H01L 21/265 |
| 2020/0058541 A1* | 2/2020 | Konishi | H01L 21/6835 |

FOREIGN PATENT DOCUMENTS

| | | |
|---|---|---|
| JP | 2005285988 A | 10/2005 |
| JP | 2014086665 A | 5/2014 |
| JP | 2015502655 A | 1/2015 |
| JP | 2016072450 A | 5/2016 |
| WO | 2013094665 A1 | 6/2013 |
| WO | 2014178356 A1 | 11/2014 |

OTHER PUBLICATIONS

"3D LSI Integration Technology," Fujitsu Corp., Sep. 2011, vol. 62 (5), pp. 601-607.
Extended European Search Report including Written Opinion for Application No. EP18832873.6, dated Mar. 16, 2021, pp. 1-10.

* cited by examiner

DEVICE SUBSTRATE WITH HIGH THERMAL CONDUCTIVITY AND METHOD OF MANUFACTURING THE SAME

CROSS-REFERENCE TO RELATED APPLICATIONS

The present application is a national phase entry under 35 U.S.C. § 371 of International Application No. PCT/JP2018/026068, filed Jul. 10, 2018, which claims priority to Japanese Patent Application No. 2017-138026, filed Jul. 14, 2017, the disclosures of which are incorporated herein by reference.

TECHNICAL FIELD

The present invention relates to a device substrate with high thermal conductivity and to a method of manufacturing the same, and more specifically relates to a device substrate with high heat dissipation and with a small loss of thermal conductivity at high frequencies, the device substrate being such that a semiconductor device layer is formed on a surface of a transfer substrate having high thermal conductivity and being an electrical insulator, the transfer substrate being a ceramic or a single crystal made of, for example, one or more of AlN, $Si_3N_4$, $Al_2O_3$, and the like, and to a method of manufacturing the same.

BACKGROUND ART

In recent years, with the refinement of design rules, the performance of silicon-based semiconductor devices has been progressively improved. However, heat dissipation from individual transistors and connecting metal wires between transistors has become a problem. In order to cope with this problem, there are cases in which, after the fabrication of the device, the back surface of the silicon is thinned to about one hundred to several hundred μm and then a fan or a metal plate is attached to a chip to facilitate heat dissipation, or a water cooling tube is stretched around to perform the cooling.

However, even when the silicon is made thin, since a region in which the device is formed extends only about several μm from the front surface, and a region other than this region acts as a heat reservoir, it cannot be said to be efficient in terms of heat dissipation. SOI (Silicon On Insulator) substrates which have been frequently used in high performance processors, high frequency devices, and the like in recent years normally have a structure in which a $SiO_2$ insulating layer in the form of a thin film is interposed between a silicon base substrate and a silicon device layer. Since the thermal conductivity of this $SiO_2$ is as extremely low as 1.38 W/m·K, the $SiO_2$ insulating layer, even in the form of the thin film, serves as a heat insulating member so that the heat dissipation resistance of the device increases, resulting in a serious problem in a device with high heat generation. On the other hand, the loss of the silicon of the base substrate is large in a high frequency region due to its dielectric properties so that the use thereof in a high frequency region at a certain level or higher has now been subjected to the limitation.

On the other hand, since an SOS (Silicon On Sapphire) substrate including a base substrate made of sapphire is excellent in electrical insulation and high frequency properties, the loss in a high frequency region is small, and therefore, it attracts attention as a high frequency device substrate. On the other hand, since the thermal conductivity of the sapphire is about ⅓ compared to the silicon of the SOI substrate, it is unsuitable for a substrate of a high density device or a high power device with high heat generation. Further, the cost of a sapphire substrate with a large diameter of 150 mm, 200 mm, or 300 mm is high, which is a serious drawback of the sapphire substrate.

In view of this, since a ceramic sintered body can obtain superior properties as a substrate at relatively low cost, for example, Patent Document 1 and Patent Document 2 disclose a substrate in which a single crystal silicon film is formed directly on a substrate of a ceramic sintered body. The ceramic sintered body is obtained by hardening a powder of aluminum nitride or silicon nitride using a sintering aid. Therefore, a metal such as iron (Fe) or aluminum (Al) contained in the powder, and a sintering aid such as alumina, are contained as impurities in the ceramic sintered body.

In order to prevent these impurities from diffusing in a device manufacturing process, Patent Document 1 and Patent Document 2 describe providing a diffusion prevention layer or the like. However, in the case in which the device manufacturing process includes a film formation process in which the temperature reaches, for example, 600° C. or higher, there is a concern that metal impurities will diffuse to affect the device properties and to contaminate a manufacturing machine.

As a technique to bond a substrate formed with a device to a transparent support substrate, for example, Patent Document 3 discloses a technique, for a back-illuminated CMOS wafer, to bond an SOI device wafer and a transparent support substrate to each other via an adhesive and then to thin the back surface of the SOI. In this bonding method, the front surface side of a device layer and the transparent substrate are bonded to each other. That is, the device layer formed on the original SOI wafer is inverted and bonded. In this case, there is a problem that wiring for establishing electrical connection is required after the device layer is transferred.

In Non-Patent Document 1, it is considered that when stacking ultra-thin device wafers, the wafers are each thinned to about 10 μm excluding a device layer, and it is assumed that the thinning is performed by grinding and CMP. In order to reduce the loss in a high frequency region, it is desirable to completely remove a Si wafer portion below a buried oxide film layer (Box layer). However, the thinning by grinding or CMP (Chemical Mechanical Polishing) that results in machining marks remaining is not preferable.

REFERENCE DOCUMENT LIST

Patent Documents

Patent Document 1: WO 2013/094665 A
Patent Document 2: JP 2016-72450 A
Patent Document 3: JP 2005-285988 A

Non-Patent Document

Non-Patent Document 1: Kitada et al., "Three-dimensional LSI integration technology", FUJITSU. 62(5), pp. 601-607 (2011)

SUMMARY OF THE INVENTION

Problem to be Solved by the Invention

The present invention has been made in view of the above circumstances and has an object to provide a device substrate with high thermal conductivity that does not require a high temperature process which causes diffusion of metal impurities, that is excellent in heat dissipation and causes only a small loss at high frequencies, and that is free of separation from a support substrate when obtaining a thinned device wafer, and to provide a method of manufacturing the device substrate.

Means for Solving the Problem

According to an aspect of the present invention, a device substrate includes: a buried layer having a higher thermal conductivity than at least $SiO_2$ and being an electrical insulator; a Si device layer formed on one surface of the thin-film buried layer; and a substrate having a higher thermal conductivity than at least $SiO_2$ and being an electrical insulator, the substrate formed on an opposite surface of the buried layer via an adhesive having a heat-resistant temperature of at least 150° C.

The buried layer may be made of one selected from a group consisting of AlN, $Si_3N_4$, $Al_2O_3$, and diamond and a combination thereof.

The substrate may be a ceramic or a single crystal made of one selected from the group consisting of AlN, $Si_3N_4$, and $Al_2O_3$ and combinations thereof.

The device substrate of the present invention may further include a layer formed between the buried layer and the substrate and made of one selected from the group consisting of $SiO_2$, $Si_3N_4$, and oxynitrides ($SiO_xN_y$) and combinations thereof.

The adhesive is preferably a thermosetting epoxy modified silicone.

The thickness of the adhesive is preferably 0.1 to 5 μm.

According to another aspect of the present invention, a method for manufacturing a device substrate includes: a provisional bonding step of provisionally bonding a Si device layer side of an SOI device substrate to a support substrate using a provisional bonding adhesive, the SOI device substrate including a Si base substrate, a buried layer formed on the Si base substrate, and a Si device layer formed on the buried layer; a Si base substrate removing step of removing the Si base substrate of the provisionally bonded SOI device substrate by one selected from the group consisting of grinding, polishing, and etching and combinations thereof until the buried layer is exposed, so as to obtain a thinned device wafer; a transfer bonding step of transfer-bonding the buried layer side of the thinned device wafer and a transfer substrate to each other using a transfer adhesive having a heat-resistant temperature of at least 150° C. by applying heat and pressure; and a separation step of separating the support substrate from the Si device layer.

The device substrate-manufacturing method of this invention may further include an adhesive removing step of removing the provisional bonding adhesive remaining on a surface of the Si device layer after the separation step. The Si base substrate removing step may further include: a thinning step of thinning the Si base substrate; an edge trimming step of trimming an outer peripheral portion of the Si base substrate along with outer peripheral portions of the buried layer, the Si device layer, and the provisional bonding adhesive; and an etching step of removing, by etching with an acid or the like, the Si base substrate remaining after these steps.

A silicone resin that has superior acid resistance is preferably used as the provisional bonding adhesive.

The buried layer is preferably made of one selected from the group consisting of AlN, $Si_3N_4$, $Al_2O_3$, and diamond, and combinations thereof.

The device substrate manufacturing method of this invention preferably further includes a step of forming an extremely thin layer on a bonding surface of the buried layer to the transfer substrate and/or a bonding surface of the transfer substrate to the buried layer, the layer made of one selected from the group consisting of $SiO_2$, $Si_3N_4$, and oxynitrides ($SiO_xN_y$) and combinations thereof.

The transfer substrate is preferably a ceramic or a single crystal made of one selected from the group consisting of AlN, $Si_3N_4$, and $Al_2O_3$ and combinations thereof.

Effects of the Invention

According to the present invention, a Si device layer is formed on one surface of a buried layer having a higher thermal conductivity than at least $SiO_2$ and being an electrical insulator, and a transfer substrate having a higher thermal conductivity than at least $SiO_2$ and being an electrical insulator is transfer-bonded to the opposite-side surface of the buried layer via a transfer adhesive having a heat-resistant temperature of at least 150° C., so that it is possible to obtain a device substrate with high thermal conductivity that does not require a high temperature process which causes diffusion of metal impurities, that is excellent in heat dissipation and causes only a small loss of thermal conductivity at high frequencies, and that is free of separation from a support substrate when obtaining a thinned device wafer.

BRIEF DESCRIPTION OF THE DRAWINGS

FIG. 1 is a flow diagram illustrating an embodiment of a device substrate manufacturing method according to the present invention.

MODE FOR CARRYING OUT THE INVENTION

Hereinafter, an embodiment of a device substrate and a manufacturing method therefor according to the present invention will be described, but the scope of the present invention is not limited to this embodiment. The device substrate manufacturing method of this embodiment is mainly composed of a provisional bonding process of provisionally bonding an SOI device substrate to a support substrate using a provisional bonding adhesive, a Si base substrate removing process of removing a Si base substrate from the provisionally bonded SOI device substrate, a transfer bonding process of transfer-bonding a transfer substrate to a portion, where the Si base substrate is removed, using a transfer adhesive, a separation process of separating the support substrate, and an adhesive removing process of removing the remaining provisional bonding adhesive. The respective components and the respective processes will be described in detail with reference to FIG. 1 of the accompanying drawings.

1. Provisional Bonding Process

Figure 1A:
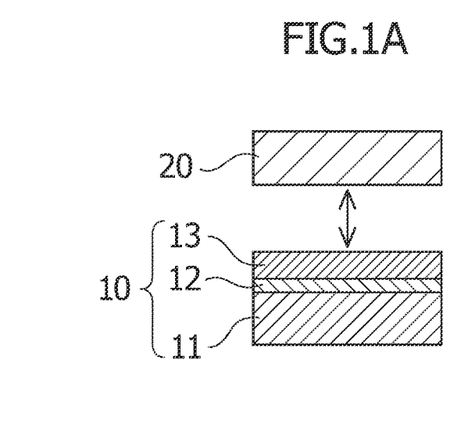

The provisional bonding process will be described. An SOI device substrate 10 formed with a device and a support substrate 20 are bonded to each other using a provisional bonding adhesive 31 (FIG. 1A). The SOI device substrate 10 includes a Si base substrate 11, a buried layer 12 formed on the Si base substrate 11, and a Si device layer 13 formed on the buried layer 12.

As the SOI device substrate 10, it is possible to use an SOI device substrate of the same configuration and materials as those of an SOI device substrate that is generally used in a high performance processor, a high frequency device, or the like. The thickness of the Si base substrate 11 is preferably 200 μm or more and more preferably 300 μm or more. By setting the thickness of the Si base substrate 11 to 200 μm or more, it is possible to convey the wafer without causing bending thereof. The upper limit of the thickness is not particularly limited, but in order to facilitate cutting, polishing, etching, or the like, described below, it is preferably set to 1000 μm or less.

The buried layer 12 has a higher thermal conductivity than at least $SiO_2$ and is an electrical insulator. Specifically, the thermal conductivity is preferably higher than 1.5 W/m·K, more preferably 10 W/m·K or more, and further preferably 100 W/m·K or more. As such a material, there are AlN, $Si_3N_4$, $Al_2O_3$, diamond, and the like.

The thickness of the buried layer 12 is preferably in a range from 50 to 10000 nm and more preferably in a range of 500 nm or less. By setting the thickness to 50 nm or more, the device layer is unlikely to be susceptible to the influence of the Si base substrate so that the processing can be performed without affecting the device layer when removing the Si base substrate. By setting the thickness to 10000 nm or less, the bonding stress becomes small so that it does not easily warp.

The thickness of the Si device layer 13 is normally 4 to 10 μm, but can be changed as appropriate according to the number of wires to be provided. By setting the thickness to 4 μm or more, multilayer wiring is enabled, and by setting the thickness to 10 μm or less, the necessary number of wires can be ensured. The thickness of the Si device layer 13 is more preferably in a range from 4 to 8 μm. Solder bumps may be formed on a surface of the Si device layer 13.

As the support substrate 20, although depending on a curing method of the provisional bonding adhesive 31 to be used, it is desirable to use a substrate with a linear expansion coefficient equivalent to that of Si. Specifically, the linear expansion coefficient is preferably $5.0 \times 10^{-6}/°$ C. or less. In a case in which the linear expansion coefficient is greater than $5.0 \times 10^{-6}/°$ C., when the heat is applied at the time of provisional bonding, since the difference in thermal expansion coefficient with respect to the silicon of the Si device layer 13 is large, there is a possibility that the entire substrate warps. As such a material, it is possible to use a Si wafer, TEMPAX, EAGLE-XG, or the like.

The provisional bonding adhesive 31 is not particularly limited as long as it is an adhesive that enables separation of two bonded layers from each other, and it is possible to use, for example, an acrylic adhesive, a silicone adhesive, an epoxy adhesive, a hot melt adhesive, or the like. Specifically, as the provisional bonding adhesive 31, it is possible to use WSS (UV curable acrylic-based adhesive) manufactured by 3M Company or an adhesive mainly composed of a thermosetting modified silicone such as TA1070T/TA2570V3/TA4070 manufactured by Shin-Etsu Chemical Co., Ltd. In particular, it is particularly preferable to use as the provisional bonding adhesive the latter adhesive mainly composed of the thermosetting modified silicone that is excellent in acid/alkali resistance at the time of back surface etching. In addition thereto, there are fluorine-based resins and the like as adhesive having excellent acid resistance.

In order to facilitate separation of two bonded layers from each other, a plurality of layers of mutually different provisional bonding adhesives 31 may be formed on the support substrate 20. The thickness of the provisional bonding adhesive 31 is not particularly limited, but is preferably in a range from 10 to 200 μm.

2. Si Base Substrate Removing Process

The Si base substrate removing process will be described. The Si base substrate removing process preferably includes a thinning process of thinning the Si base substrate 11, an edge trimming process of trimming outer peripheral portions of the SOI device substrate 10 and the provisional bonding adhesive 31 that are provisionally bonded to the support substrate 20, and an etching process of removing, by etching, the Si base substrate 11 remaining after those processes.

Figure 1B:
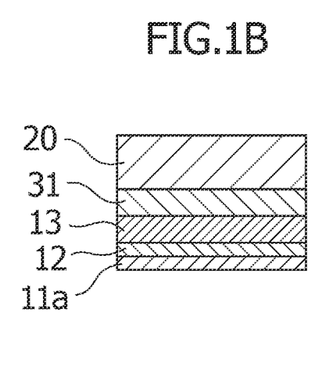

The thinning process of the Si base substrate removing process will be described. After the provisional bonding process, the Si base substrate 11 of the SOI device substrate 10 is thinned (FIG. 1B). There are grinding, polishing, etching, and the like as a thinning method, which may be changed as appropriate according to need. It is preferable to perform the thinning by grinding in terms of the throughput, and it is further preferable to perform the thinning by machining, for example, combining #600 to #2000 grindstones. After the grinding, smoothing may be performed by, for example, CMP, dry polishing, or the like as needed.

In order to prevent the machining distortion from affecting the Si device layer 13, it is preferable to leave the Si base substrate 11 by 10 to 100 μm, and the thickness to be left is more preferably 20 μm or more and 50 μm or less. By setting the thickness of a thinned Si base substrate 11a to 10 μm or more, the machining distortion hardly affects the Si device layer 13, and by setting the thickness thereof to 100 μm or less, the etching time for removing the thinned Si base substrate 11a by etching thereafter can be shortened.

Figure 1C:
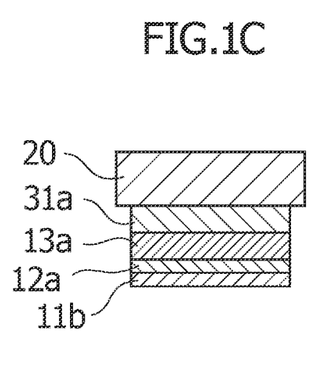

Next, the edge trimming process of the Si base substrate removing process will be described. After sufficiently thinning the Si base substrate 11 in the thinning process, edge trimming is performed (FIG. 1C). The layer of the provisional bonding adhesive 31 tends to be thickened at the outer peripheral portion of the SOI device substrate 10 compared to at the in-plane center thereof. Therefore, in order to leave a uniform thickness portion of the provisional bonding adhesive 31, the outer peripheral portions of the SOI device substrate 10 and the provisional bonding adhesive 31 are removed. The edge trimming amount can be determined as appropriate so that the residue of the provisional bonding adhesive 31 can be sufficiently removed while not reducing the area of a device portion. Specifically, a portion of 2 to 5 mm from the edge of the SOI device substrate 10 toward the in-plane center thereof is removed along with the provisional bonding adhesive 31. Note that since the provisional bonding adhesive 31 is not coated on the support substrate 20, it is not necessary to perform the edge trimming of the support substrate 20.

As an edge trimming method, there are grinding by a grinder, tape polishing using a polishing film, and the like. The tape polishing is preferable. When the grinding by the grinder is performed, in a case in which the modified silicone is used as the provisional bonding adhesive 31, the grindstone is subjected to clogging due to the resin being soft so that seizure or separation of the substrate occurs. On the other hand, when the edge trimming is performed by the tape polishing, separation of the Si device layer 13 from the support substrate 20, cracking thereof, or the like does not occur so that excellent trimming is enabled.

Figure 1D:
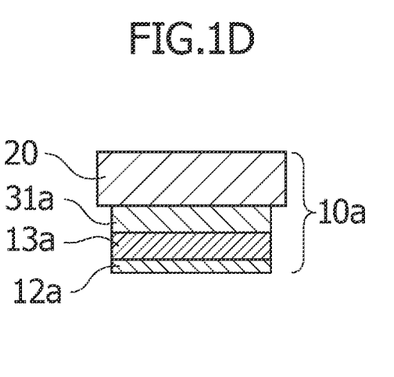

Next, the etching process of the Si base substrate removing process will be described. Subsequent to the edge trimming process, etching is performed to completely remove a remaining Si base substrate 11b, thereby obtaining a thinned device wafer 10a (FIG. 1D). The etching can be performed with an acid or an alkali, but in terms of the etching rate, the etching with acid is preferable. This is because while it takes one hour or more at 70° C. to etch the Si base substrate 11b of 20 μm by etching with an alkali such as KOH or $NH_4OH$, it is possible to etch the same in several minutes at room temperature by etching with an acid. As an acid to be used, an acid obtained by freely selecting and mixing strong acids such as HF, $HNO_3$, $CH_3COOH$, $H_2SO_4$, and $H_3PO_4$ is more preferable. When completely removing the Si base substrate 11b, the thinning by conventionally used grinding or CMP is not preferable due to the remaining of machining marks. As the etching with the acid, wet etching is further preferable in terms of the etching rate. By completely removing the Si base substrate 11b in this way, the loss in a high frequency region can be further reduced.

Further, the etching is performed by immersion or single-side spin etching. In terms of suppressing etching of the support substrate 20, the single-side spin etching is preferable. A layer of a provisional bonding adhesive 31a is exposed at the outer peripheral portion of the SOI device substrate 10 by performing the edge trimming When the provisional bonding adhesive 31 used has no resistance to an acid, the provisional bonding adhesive 31 is eroded by an etching solution from the outer peripheral portion of the SOI device substrate 10 so that wrinkles occur from the outer peripheral portion of the Si device layer 13 to cause separation. For example, when WSS (UV curable acrylic-based adhesive) with no resistance to an acid manufactured by 3M Company is used as the provisional bonding adhesive 31, erosion occurs due to an acid to cause separation from the outer peripheral portion of the SOI device substrate 10, which is not suitable for use in the present invention. In contrast to this, when a modified silicone-based adhesive having resistance to acid is used as the provisional bonding adhesive 31, separation does not occur so that etching is enabled until the thin-film buried layer 12 having high thermal conductivity and being an electrical insulator is exposed. The substrate obtained in this process, with the Si base substrate 11b completely removed, will be referred to as the thinned device wafer 10a.

3. Transfer Bonding Process

The transfer bonding process will be described. A transfer adhesive 32 is coated on a transfer substrate 40 being an electrical insulator (FIG. 1E) and is bonded to the thinned device wafer 10a (FIG. 1F).

Preferably, the transfer substrate 40 makes it possible to obtain a wafer size of 200 to 300 mm in diameter. It is preferable to use sapphire, alumina, an MN sintered body, a $Si_3N_4$ sintered body, diamond, or the like. This is because these each have a higher thermal conductivity than $SiO_2$ and are electrical insulators, and further, these are preferable in terms of cost compared to a single crystal, which is generally expensive. Specifically, the thermal conductivity is preferably higher than 1.5 W/m·K, more preferably 10 W/m·K or more, and further preferably 100 W/m·K or more.

Taking into account the process temperature after the formation of the Si device layer 13, the transfer adhesive 32 has a resistance to 150° C., preferably to a temperature of 250° C., and more preferably to a temperature of 300° C., and, in order to reduce the stress to the Si device layer 13 at the time of transfer bonding, it is preferable to use a silicone resin, an epoxy modified rubber, an epoxy modified silicone, or the like. In particular, the epoxy modified silicone is most preferable because the strength as an adhesive is high, the thermal stress at the time of curing is small, it can be formed to be thin, and the bonding force is maintained. Specifically, the thermosetting modified silicones such as TA1070T, TA2570V3, and TA4070 manufactured by Shin-Etsu Chemical Co., Ltd. are preferable.

The thickness of the layer of the transfer adhesive 32 is preferably 0.1 to 5 μm, more preferably 0.1 μm or more and 2 μm or less, and further preferably 0.1 μm or more and 1 μm or less. When the thickness of the layer of the transfer adhesive 32 exceeds 5 μm, the heat dissipation becomes ½ or less compared to a case in which the transfer adhesive 32 is not provided, and therefore, it is preferable to provide the transfer adhesive 32 of 5 μm or less for enhancing the thermal conductivity. By setting the thickness to 0.1 μm or more, it is possible to maintain the sufficient bonding strength and to uniformly coat the transfer adhesive 32 in the plane thereby to facilitate the bonding.

The thermal conductivity of the transfer adhesive 32 is as small as about 1 W/m·K, and therefore, in order to manufacture a substrate with a high thermal conductivity, it is preferable to form the transfer adhesive 32 to be thin and uniform as much as possible.

Before coating the transfer adhesive 32, a thin film made of one selected from a group including $SiO_2$, $Si_3N_4$, and oxynitrides ($SiO_xN_y$) or a combination thereof may be formed on a bonding surface of the transfer substrate 40 to a buried layer 12a. By forming such a thin film, it is possible to improve the surface roughness and the wettability, thereby improving the bonding force. The thickness of the thin film is preferably in a range from 0.05 to 10 μm. A film forming method is not particularly limited, but, for example, a plasma film forming method, a chemical vapor deposition method, a physical vapor deposition method, and the like are preferable. The thin film may be formed on a surface of the buried layer 12a of the thinned device wafer 10a instead of, or in addition to, forming it on the transfer substrate 40.

Figure 1E:
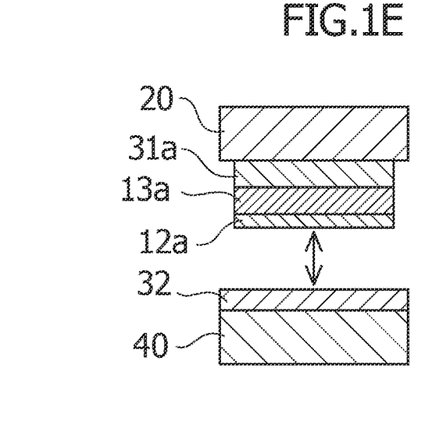
Figure 1F:
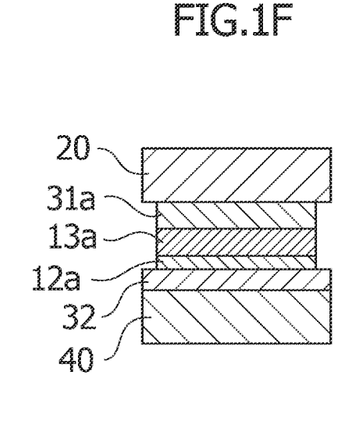

As illustrated in FIG. 1E, the buried layer 12a is exposed at the surface of the thinned device wafer 10a. The buried layer 12a is normally 50 to 1000 nm, but after the Si base substrate 11b is completely removed, the buried layer 12a is locally deformed due to local stresses by pattern wiring of the Si device layer 13 so that steps of 1 to 10 nm in height occur corresponding to the wiring pattern. With these steps, it is not possible to bond the buried layer 12a to the transfer substrate 40 by direct bonding or plasma bonding. Therefore, in order to bond the surface with the steps to the transfer substrate 40, the bonding is performed via the transfer adhesive 32.

After the transfer adhesive 32 is coated, it is preferable to perform baking and half-curing at 100 to 200° C. for removing a solvent and preventing degassing due to heating at the time of bonding. Preferably, the temperature is 120° C. or more and 180° C. or less.

In this event, if the transfer adhesive 32 is coated on the buried layer 12a side and then the baking is performed, there are cases in which the components of the provisional bonding adhesive 31a are deformed to cause the occurrence of lamellar irregularities or voids. Therefore, it is preferable to coat the transfer adhesive 32 on the transfer substrate 40 side.

As a method of coating the transfer adhesive 32, it is possible to use a method such as die coating, slit coating, dip coating, or spin coating. The spin coating is preferable because it enables uniform coating only on the bonding surface side.

As illustrated in FIG. 1F, the buried layer 12a and the transfer substrate 40 coated with the transfer adhesive 32 are bonded to each other. For example, subsequent to heating before the bonding, the bonding surfaces of the thinned device wafer 10a and the transfer substrate 40 coated with the transfer adhesive 32 are faced each other and brought into contact with each other while applying the load thereto. Heating is performed while maintaining the load so that the transfer adhesive 32 is fully cured to achieve the bonding. The upper limit of the load to be applied is, for example, less than 20 kgf/cm$^2$, preferably 10 kgf/cm$^2$ or less, and more preferably 5 kgf/cm$^2$ or less. By setting the upper limit of the load to less than 20 kgf/cm$^2$, it is possible to perform the bonding with a load that does not cause deformation of the Si device layer 13, particularly the solder bumps thereof. On the other hand, it is preferable to apply a load of 1 kgf/cm$^2$ or more. By setting the load to 1 kgf/cm$^2$ or more, the stacking is performed while correcting a warp of 5 to 50 μm which the transfer substrate 40 itself has. The thinned device wafer 10a and the transfer substrate 40 both can have the warps, and these warps can be corrected by applying the load at the time of the bonding.

The heating temperature at the time of the bonding is preferably as high as possible within a range not exceeding a heat-resistant temperature of the transfer adhesive 32 and a melting point of the solder bumps. In particular, the heating temperature at the time of the bonding is more preferably 15 to 50° C. lower than and further preferably 20 to 40° C. lower than the heat-resistant temperature of the used transfer adhesive 32 or the melting point of the used solder bumps, whichever is lower. For example, when the melting point of the solder bumps is 250° C., the temperature is raised to a temperature range of preferably 200 to 245° C. and more preferably 220 to 240° C.

The time of maintaining in the heating temperature range at the time of the bonding is preferably as short as possible in terms of the throughput. The maintaining time is 1 to 60 minutes, preferably 2 to 30 minutes, and more preferably 5 to 10 minutes.

The transfer bonding can be performed in either an atmospheric or under a vacuum, but is preferably performed under a vacuum of $1E^{-1}$ to $1E^{-5}$ Torr and preferably $1E^{-2}$ to $1E^{-4}$ Torr. By setting the vacuum to $1E^{-5}$ Torr or more, the transfer bonding can be performed to prevent air bubbles from remaining at the bonding interface.

Since the transfer bonding process is the method of transferring a Si device layer 13a without inverting it, the transfer can be performed in the state in which the Si device layer 13a is formed with up to the solder bumps, and therefore, there is no need for a process to form active portions, such as electrical wiring, after the transfer.

4. Separation Process

Figure 1G:
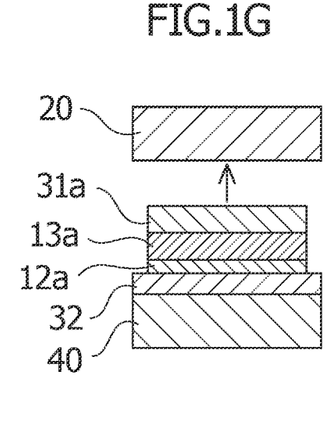

The separation process will be described. The provisionally bonded support substrate 20 is separated (FIG. 1G). The separation process can be normally performed by a physical means (including a mechanical means) or a chemical means either alone or in combination thereof. For example, the support substrate 20 is detached by a mechanical force, for example, by inserting a wedge between ends of bonding surfaces, so that the support substrate 20 is easily separated. As a chemical means, it is possible to use, for example, swelling or dissolution by a solvent, or the like. As a photochemical means, it is possible to use photo-curing or the like.

5. Adhesive Removing Process

Figure 1H:
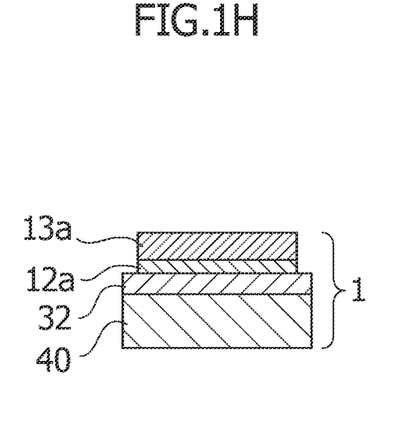

The adhesive removing process will be described (FIG. 1H). As needed, the adhesive removing process can be performed to clean the residue of the provisional bonding adhesive 31a remaining on the surface of the Si device layer 13a. Since the provisional bonding adhesive 31 is swollen by an organic solvent such as p-menthane, it is possible to easily remove the residue of the provisional bonding adhesive 31a by immersing the Si device layer 13a in p-menthane. The immersion time is 1 to 10 minutes and preferably 3 to 5 minutes.

By the device substrate manufacturing method of this embodiment described above, it is possible to obtain a device substrate 1 in which the Si device layer 13a, the buried layer 12a, and the transfer substrate 40 are stacked via the transfer adhesive 32. As described above, the device substrate manufacturing method of this embodiment does not require a high temperature process that causes diffusion of metal impurities. Further, the buried layer 12a and the transfer substrate 40 each have the high thermal conductivity and are electrical insulators, thus resulting in excellent heat dissipation and a small loss at high frequencies. Further, when obtaining the thinned device wafer 10a, since, as described above, the Si base substrate 11 of the SOI device substrate 10 is removed under predetermined conditions suitable for the removal, there is no occurrence of separation from the support substrate 20.

EXAMPLES

Hereinafter, the present invention will be described in more detail with reference to Examples and Comparative Examples, but the present invention is not limited thereto.

Example 1

As an SOI device substrate formed with a device, use was made of a wafer including a Si device layer with an outer diameter of 300 mm and a thickness of 4 μm, a thin-film buried layer with a thickness of 250 nm made of AlN, and a Si base substrate with a thickness of 725 μm. Solder bumps each having a diameter of 80 μm were formed on an outermost surface of the device at a minimum pitch of 150 μm.

As a provisional bonding adhesive, silicone resin adhesives TA1070T/TA2570V3/TA4070 manufactured by Shin-Etsu Chemical Co., Ltd. were stacked and coated by spin coating on a surface, provided with the Si device layer, of the SOI device substrate. Specifically, first, TA1070T was stacked to 10 μm as a device protection layer, then TA2570V3 was stacked to 10 μm as a layer serving as a separation surface of a support substrate after processing, and then TA4070 was stacked to 100 μm as a bonding layer to the support substrate. A Si wafer was used as the support substrate. Using a semi-automated wafer bonder EVG520IS manufactured by EV Group Company, the provisional bonding adhesive and the support substrate were held and bonded to each other under a vacuum of $10^{-4}$ Torr with a load of 1 kgf/cm$^2$ at 140° C., and then the provisional bonding adhesive was cured by a treatment in an oven at 190° C. for 2 hours.

Then, using a polish grinder PG300 manufactured by Tokyo Seimitsu Co., Ltd., the Si base substrate located on the back side of the SOI device substrate was thinned to a thickness of 40 μm by the use of a #2000 grindstone. Although saw marks were observed on a surface after the grinding, separation, cracking, or edge chipping of the wafer was not observed.

Subsequently, using a wafer edge polishing machine NME-123N manufactured by MIPOX Corporation, edge trimming was performed by tape polishing. The trimming width was set to 2 mm inward from the outermost periphery of the wafer. The trimming was performed without causing cracking or separation.

Subsequently, using a spin etcher MSE2000 manufactured by Mimasu Semiconductor Industry Co., Ltd., the Si base substrate of 40 μm in thickness remaining on the back side was removed by spin etching with an acid. The acid used was a mixed acid of $HF/HNO_3/H_3PO_4/H_2SO_4$, and the Si base substrate was completely removed in an etching time of 3 minutes, thereby obtaining a thinned device wafer.

Then, as a transfer substrate having high thermal conductivity and being an electrical insulator, use was made of an AlN sintered body substrate with an outer diameter of 300 mm, a thickness of 725 μm, a thermal conductivity of 200 W/m·K, and a resistivity of $5E^{+15}$ Ω·cm. As a transfer adhesive, TA4070 being a thermosetting epoxy modified silicone adhesive with low stress was diluted with cyclopentanone to prepare a coating solution with a 0.5 wt % adhesive concentration. The coating solution was spin-coated on the AlN wafer prepared as the transfer substrate so that a layer of the transfer adhesive with a thickness of 1 μm was formed with an in-plane variation of ±5%. The transfer substrate coated with the transfer adhesive was baked at 150° C. for 5 minutes, thereby performing solvent removal and half-curing.

Subsequently, using a wafer bonder SB8 manufactured by Suss Micro Tec AG, the thinned device wafer and the transfer substrate were bonded to each other. The transfer substrate coated with the transfer adhesive and the thinned device wafer were stacked with each other at room temperature and then were bonded to each other by applying a load of 3 kgf/cm² and holding them under a vacuum of $1E^{-4}$ Torr at 240° C. for 10 minutes. Thereafter, the load was released at a temperature of 65° C. or less, and the bonded wafer was taken out.

By inserting a wedge into the provisional bonding interface of the bonded wafer to mechanically separate the support substrate, the Si device layer was transferred to the transfer substrate via the buried layer. In appearance, there was no separation of the transferred Si device layer. Further, as a result of observing a device pattern in the plane using an optical microscope, there was no separation of the pattern, and separation of the solder bumps was also not observed.

The buried layer with the Si device layer transferred thereto was immersed in p-menthane for 5 minutes, thereby removing the provisional bonding adhesive remaining on the surface. No separation was observed at the interface between the transferred Si device layer and the buried layer, and the transfer adhesive was not eluted by p-menthane. As a result of observing the device surface after cleaning using the optical microscope, separation of the pattern or deformation of the solder bumps was not observed. In this way, the Si device layer was transferred to the buried layer in the state in which the original device pattern was maintained. After dividing individual devices from the transfer substrate, a high frequency of 1 GHz was applied thereto and the surface temperature of the devices was measured after one hour, and as a result, the rise in temperature was hardly observed. Further, isolation between signal and noise was extremely high and thus was excellent.

Example 2

There was prepared an SOI device substrate that was the same as that of Example 1 except that diamond synthesized from a mixed gas of methane and hydrogen, having high thermal conductivity, being an electrical insulator, and having a thickness of 200 nm was used as a buried layer, and a device substrate was manufactured via a thinned device wafer in the same manner as in Example 1. However, a $Si_3N_4$ substrate was used as a transfer substrate instead of the MN substrate. Coating of a transfer adhesive was performed in the same manner, but bonding was performed by reducing the load to 1 kgf/cm².

The thinned device wafer was uniformly bonded. As a result of separating a support substrate, a Si device layer was transferred to the transfer substrate via the buried layer. As a result of observing the Si device layer after cleaning using an optical microscope, separation or deformation of bumps was not observed. As a result of measuring the rise in temperature of the transfer substrate under the same conditions as in Example 1, the temperature rose by about 3° C. from that before the measurement, but thereafter, no further temperature rise was observed so that the temperature was substantially constant and stable. Further, isolation was excellent.

Example 3

There was prepared an SOI device substrate that was formed in the same manner as in Example 1 except that a buried layer of the SOI device substrate was $Al_2O_3$ coated by a sputtering method, having high thermal conductivity, being an electrical insulator, and having a thickness of 150 nm, and a device substrate was manufactured via a thinned device wafer in the same manner as in Example 1. Coating of a transfer adhesive on the buried layer was performed in the same manner, but bonding was performed by increasing the load to 10 kgf/cm².

The thinned device wafer was well bonded. As a result of separating a support substrate, a Si device layer was transferred to a transfer substrate via the buried layer. As a result of observing the Si device layer after cleaning using an optical microscope, separation or deformation of bumps was not observed. As a result of measuring the rise in temperature under the same conditions as in Example 1, a rise of about 5° C. was observed, but no further rise occurred. Further, isolation was excellent.

Example 4

There was prepared an SOI device substrate described in Example 1, and a device substrate was manufactured via a thinned device wafer in the same manner as in Example 1. However, a $Si_3N_4$ substrate was used as a transfer substrate instead of the AlN substrate, and $SiO_2$ was coated to about 1 μm on a bonding surface to a buried layer by a plasma film forming method in advance, and then polishing was performed to achieve smoothing to Ra 0.5 nm. Thereafter, coating of a transfer adhesive was performed in the same manner as in Example 1, but bonding was performed by reducing the temperature to 220° C.

The thinned device wafer was bonded. As a result of separating a support substrate, a Si device layer was transferred to the transfer substrate via the buried layer. As a result of observing the Si device layer after cleaning using an optical microscope, separation or deformation of bumps was not observed so that a fine state was maintained. As a result of measuring the rise in temperature in the same manner as in Example 1, the temperature was about 7.5° C. and was constant thereafter. There was no particular problem for isolation.

Example 5

There was prepared an SOI device substrate described in Example 1, and a device substrate was manufactured via a thinned device wafer in the same manner as in Example 1. However, a sapphire substrate was used as a transfer substrate instead of the AlN substrate, and, in coating of a transfer adhesive, a coating solution with a 0.05 wt % adhesive concentration was prepared, and the layer thickness of the transfer adhesive after coating was made to be 0.1 μm.

The thinned device wafer was bonded. As a result of separating a support substrate, a Si device layer was transferred except a region of 10 mm from the outer periphery. Since most of the transfer was achieved, it was seen that providing a layer of the transfer adhesive having a thickness of at least 0.1 μm or more was necessary for the transfer of the entire surface. The rise in temperature of individual devices was measured under the same conditions as in Example 1. A temperature rise of about 11° C. was observed, but the temperature was constant thereafter and no particular problem occurred. There was no particular problem for isolation in practical use.

Comparative Example 1

There was prepared a normal SOI device substrate of 200 mm in diameter in which a $SiO_2$ buried layer of 100 nm in thickness was formed on a Si base substrate and an Si device layer that was the same as that of Example 1 was formed, and a device substrate was manufactured via a thinned device wafer in the same manner as in Example 1 except that a transfer substrate of synthetic quartz was used instead of the transfer substrate of the MN sintered body. As a result of using as a 1 GHz high frequency device as in Example 1, the temperature of the device rose to 60° C. and noise/signal isolation was significantly worsened so that the device was unusable.

Comparative Example 2

There was prepared an SOI device substrate that was the same as that of Example 1, and a device substrate was manufactured via a thinned device wafer in the same manner as in Example 1. However, a liquid epoxy resin with a heat-resistant temperature of 120° C. was used as a transfer adhesive and was coated not on a transfer substrate made of AlN, but on the thinned device wafer side by spin coating, and baking was performed at 110° C. As a result, the thinned device wafer was subjected to wrinkles and separated from a support substrate. That is, they were not bonded to each other, and in the state in which the thickness of the thinned device wafer was thin, it was not possible to suppress deformation of a provisional bonding adhesive due to heat so that the wrinkles occurred. In addition, since the heat-resistant temperature of the transfer adhesive was low, the transfer substrate also could not bear soldering heat so that most of devices of the transfer substrate were subjected to conduction failure.

Comparative Example 3

Using WSS manufactured by 3M Company as a provisional bonding adhesive, provisional bonding to a support substrate was performed. The WSS was a UV curable acrylic-based adhesive, and it was configured that a separation layer was provided by irradiating YAG laser. Therefore, the support substrate needed to be transparent in the UV to near infrared region, and herein a TEMPAX substrate was used as the support substrate. Other than this, the back surface was ground, edge trimming was performed, and etching with an acid was performed in the same manner as in Example 1. An outer peripheral portion of a device wafer after the trimming was separated, and wrinkles occurred toward the center of the substrate. This is because a UV absorbing layer used as the WSS was eroded by the acid and separated from the support substrate. Since the erosion by the acid was confirmed, spin etching was attempted at 70° C. using 50% KOH being an alkali, but separation occurred at the outer peripheral portion of the device wafer during the etching. With the WSS, in the state in which bonding between a thinned device wafer and the support substrate was maintained, it was not possible to completely remove a Si base substrate on the wafer back side.

While embodiments have been described above, the present invention is not limited to these examples. For example, those obtained by adding, deleting, or changing the design of constituent components which a person skilled in the art performs as appropriate with respect to the foregoing respective embodiments, and those obtained by combining the features of the respective embodiments as appropriate are also included in the scope of the present invention as long as they are according to the gist of the present invention.

REFERENCE SYMBOL LIST

1 Device Substrate
10 SOI Device Substrate
10a Thinned Device Wafer
11 Si Base Substrate
12 Buried Layer
13 Si Device Layer
20 Support Substrate
31 Provisional Bonding Adhesive
32 Transfer Adhesive
40 Transfer Substrate

The invention claimed is:

1. A device substrate comprising:
a buried layer having a higher thermal conductivity than at least $SiO_2$ and being an electrical insulator, the buried layer having a thickness of 50 to 10000 nm;
a Si device layer formed on one surface of the buried layer;
a substrate having a higher thermal conductivity than at least $SiO_2$ and being an electrical insulator, the substrate formed on an opposite surface of the buried layer;
an adhesive having a heat-resistant temperature of at least 150° C., the adhesive formed between the buried layer and the substrate.

2. The device substrate according to claim 1, wherein the buried layer is made of one selected from the group consisting of AlN, $Si_3N_4$, $Al_2O_3$, and diamond, and a combination thereof.

3. The device substrate according to claim 1, wherein the substrate is a ceramic or a single crystal made of one selected from the group consisting of AlN, $Si_3N_4$, and $Al_2O_3$, and a combination thereof.

4. The device substrate according to claim 1, further comprising a layer formed between the buried layer and the substrate and made of one selected from the group consisting of $SiO_2$, $Si_3N_4$, and oxynitrides ($SiO_xN_y$), and a combination thereof.

5. The device substrate according to claim 1, wherein the adhesive is a thermosetting epoxy modified silicone.

6. The device substrate according to claim 1, wherein a thickness of the adhesive is 0.1 to 5 μm.

7. A method for manufacturing a device substrate, comprising:

a provisional bonding step of provisionally bonding a Si device layer side of an SOI device substrate to a support substrate using a provisional bonding adhesive, the SOI device substrate including a Si base substrate, a buried layer formed on the Si base substrate, and a Si device layer formed on the buried layer, the buried layer having a thickness of 50 to 10000 nm;

a Si base substrate removing step of removing the Si base substrate of the provisionally bonded SOI device substrate by one selected from the group consisting of grinding, polishing, and etching and a combination thereof until the buried layer is exposed, so as to obtain a thinned device wafer;

a transfer bonding step of transfer-bonding the buried layer side of the thinned device wafer and a transfer substrate to each other using a transfer adhesive having a heat-resistant temperature of at least 150° C. by applying heat and pressure; and a separation step of separating the support substrate from the Si device layer.

8. The device substrate-manufacturing method according to claim 7, further comprising an adhesive removing step of removing the provisional bonding adhesive remaining on a surface of the Si device layer after the separation step.

9. The device substrate-manufacturing method according to claim 7, wherein a silicone resin having acid resistance is used as the provisional bonding adhesive.

10. The device substrate-manufacturing method according to claim 7, wherein the buried layer is made of one selected from the group consisting of AlN, $Si_3N_4$, $Al_2O_3$, and diamond, and a combination thereof.

11. The device substrate-manufacturing method according to claim 7, further comprising a step of forming a layer on a bonding surface of the buried layer to the transfer substrate and/or a bonding surface of the transfer substrate to the buried layer, the layer made of one selected from the group consisting of $SiO_2$, $Si_3N_4$, and oxynitrides ($SiO_xN_y$), and a combination thereof.

12. The device substrate-manufacturing method according to claim 7, wherein the transfer substrate is a ceramic or a single crystal made of one selected from the group consisting of AlN, $Si_3N_4$, and $Al_2O_3$, and a combination thereof.

* * * * *